United States Patent [19]
Peidous

[11] Patent Number: 5,721,174
[45] Date of Patent: Feb. 24, 1998

[54] NARROW DEEP TRENCH ISOLATION PROCESS WITH TRENCH FILLING BY OXIDATION

[75] Inventor: Igor V. Peidous, Singapore, Singapore

[73] Assignee: Chartered Semiconductor Manufacturing Pte Ltd, Singapore, Singapore

[21] Appl. No.: 794,596

[22] Filed: Feb. 3, 1997

[51] Int. Cl.[6] ................................. H01L 21/76
[52] U.S. Cl. .................. 438/445; 438/444; 438/452; 438/297; 438/225; 148/DIG. 50
[58] Field of Search ............................. 437/61, 62, 67, 437/72; 148/DIG. 50; 438/444, 445, 452, 297, 225

[56] References Cited

U.S. PATENT DOCUMENTS

| | | | |
|---|---|---|---|
| 4,361,600 | 11/1982 | Brown | 437/62 |
| 4,580,330 | 4/1986 | Pollack et al. | 437/61 |
| 4,604,162 | 8/1986 | Sobczak | 437/62 |
| 4,615,746 | 10/1986 | Kawakita et al. | 437/72 |
| 4,845,048 | 7/1989 | Tamaki et al. | 437/67 |
| 5,229,318 | 7/1993 | Straboni et al. | 437/69 |
| 5,399,520 | 3/1995 | Jang | 437/67 |
| 5,470,783 | 11/1995 | Chiu et al. | 437/72 |
| 5,472,906 | 12/1995 | Shimizu et al. | 437/72 |

*Primary Examiner*—Trung Dang
*Attorney, Agent, or Firm*—George O. Saile; Stephen B. Ackerman; William J. Stoffel

[57] ABSTRACT

The invention is a process for filling narrow isolation trenches with thermal oxide using a nitride spacer and a second trench etch. The method begins by providing forming a pad oxide layer 20 and a first nitride layer 30 over a substrate. A first opening is formed in the pad oxide layer 20 and first nitride layer 30. The substrate is then etched through the first opening forming a first trench 40 in the substrate. A thin oxide film 50 is then grown over the substrate in the bottom and sidewalls of the first trench 40. Nitride spacers 60 are grown over the sidewalls of the first trench and over the thin oxide layer 40 on the sidewalls of the trench. A portion of the thin oxide film 50 on the bottom of the trench is etched. The substrate in the bottom of the first trench is etched forming a second trench 70. The etch exposes portions of the substrate on the bottom of the deeper second trench. The bottom and sidewalls of the second trench is oxidized forming a isolation oxide layer 80 C thereby filling the second trench. The oxide pushes the spacers 60 up till the spacers close off the trench 70 thereby slowing the oxidation rate. The slow oxidation rate reduces stress by the oxide on the trench walls by allowing the viscous oxide to flow.

19 Claims, 7 Drawing Sheets

FIG. 1A

- grow pad oxide
- deposit 1st SiN
- pattern to form 1st opening
- etch substrate to form shallow trench

- grow thin oxide

- form
  SiN spacer (60)
- remove exposed portion of thin oxide (50)
- etch deep trench (70)

- initial stage of deep trench oxidation

*FIG. 6A* o oxidation stopped in bulk of trench by the SiN spacer (60)

NARROW DEEP TRENCH ISOLATION PROCESS WITH TRENCH FILLING BY OXIDATION

BACKGROUND OF INVENTION

1) Field of the Invention

This invention relates generally to the fabrication of buried localized oxidation of a silicon substrate and more particularly to the fabrication of an oxide isolation layer in a narrow trench for a semiconductor device.

2) Description of the Prior Art

The fabrication of an integrated circuit normally begins by processing the semiconductor substrate to divide the surface area into regions where active devices and substrate embedded interconnects are to be formed, and other regions of dielectric which electrically separate the active regions. The field oxide dielectric material is routinely silicon dioxide. Though various field oxide formation techniques have been developed and described, the technique commonly known as the localized oxidation of silicon (LOCOS) remains common therein the semiconductor industry. In the practice of LOCOS, the active regions of the silicon substrate are masked by a silicon nitride layer, while the filed oxide regions are thermally oxidized to form a field dielectric region. Though fundamentally simple and efficient, the LOCOS process and its progeny, such as the FUROX and SWAMI techniques, exhibit deficiencies which reduce yield or performance in the final semiconductor chip product.

The most frequently encountered deficiency in the prior an techniques is commonly known as the bird's beak problem, wherein the field oxide extends under the masking nitride layer to consume some of the usable active area. Additional problems routinely encountered with known field oxide formation processes include stress induced dislocations at the edges of the active regions, and the presence of a relatively non-planar surface in or adjacent the fully formed field oxide. The non-planar recesses or notches at the edges of the active regions often degrade subsequently formed gate oxide, which can trap conductive layer residuals creating short circuit paths. Solutions to theses problems have been proposed, but routinely involve relatively complex or dimensionally critical fabrication sequences which are costly to proactive or degrade the semiconductor chip yield.

Another isolation method is the trench isolation method which usually comprises the steps of etching a trench in a substrate, coveting the trench with a dielectric material and depositing a dielectric material (e.g., oxide) to fill the trench followed by the planarization of the surface of the structure. However, compared to deposited oxides, thermally grown oxide has better electrical and mechanical properties, intrinsic charge, density, stability, etc.

One of the most important requirements for the trench isolation technique is the void-free filling of the trenches. This requirement is difficult to satisfy with narrow trench approach is applied because of the non-uniformity of the material deposition on the surface of the wafer and in the bulk of the trench.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,399,520 (Jang), U.S. Pat. No. 5,229,3 18 (Stranboni et al.), U.S. Pat. No. 5,472,906 (Shimizu et al.), and U.S. Pat. No. 5,470,783(Chiu et al.).

Though a number of the techniques mitigate the bird's beak problem and usually provide relatively planar final concluding surfaces, the approaches routinely create stress induced dislocations at the edges of the active regions and form topologies which include notches or grooves of sufficient dimensions to cause the degradation of subsequently formed gate oxide. The stress induced dislocation are often not even recognized, while the notches or grooves are most often visible in the SEM cross-sections of the final structures.

SUMMARY OF THE INVENTION

It is an object of the present invention to provide a method for fabricating an isolation oxide layer that fills deep narrow trenches without generation of excess stress in the trench/device area.

It is another object of the present invention to provide a method of filling a narrow trench with thermal oxide using a spacer automatically that limits the oxide growth in the trench thereby reducing stress.

It is yet another object of the present invention to provide a method of void free filling of a deep trench with thermal oxide using a two trench etch process and a nitride spacer to reduce stress and bird's beak problems.

To accomplish the above objectives, the present invention provides a method of narrow trench isolation on a semiconductor substrate 10. The method comprises forming a pad oxide layer 20 over a semiconductor substrate 10. A first nitride layer 30 is formed over the pad oxide layer 20. The first nitride layer 30 and the pad oxide layer 20 are patterned forming a first opening thereby exposing the substrate surface. The substrate is then etched through the first opening forming a first trench 40 in the substrate. The first trench is about as wide as deep. A thin oxide film 50 is then grown over the substrate in the bottom and sidewalls of the first trench 40. A nitride spacer 60 is grown over the sidewalls of the first trench and over the thin oxide layer 40 on the sidewalls of the trench. A portion of the thin oxide film 50 on the bottom of the trench is etched. The substrate in the bottom of the first trench is etched forming a deeper, second trench 70. The etch exposes portions of the substrate on the bottom of the second trench.

The exposed substrate surface in the second trench is wet shallow etched thereby removing any ion induced defects. The bottom of the second trench is oxidized forming an isolating layer 80 thereby filling the second trench. The oxide pushes the spacers up from the sidewalls till the ends of the spacers are together. The spacers reduce the oxidation rate. The slow oxide growth rate reduces stress by allowing the oxide to flow to relieve stress.

The present invention provides a process for forming a narrow deep trench isolation regions using a thermal oxidation. The nitride spacers 60 of the invention stop the oxidation of the substrate in the trench by blocking off the oxygen diffusion path. The unique second trench of the invention allows the trench to be made deeper. The advantage of the spacers in combination with the second deeper 70 trench (compared to a one etch trench) allows deeper isolation and narrower isolation. The deeper isolation has better electrical characteristics (better isolation) and it can isolate deep device elements. The spacer's suppression of the trench oxidation reduces stress on the trench sidewall. This reduced stress reduces silicon defects which increases yields.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 8A contains a legend for FIGS. 8A–8F.

FIG. 8A contains a legend for FIGS. 8A–8F.

DETAILED DESCRIPTION OF THE PREFERRED EMBODIMENTS

The present invention will be described in detail with reference to the accompanying drawings. The present invention provides a method of forming a deep narrow trench isolation 80C on a semiconductor substrate 10.

Figure 1A:
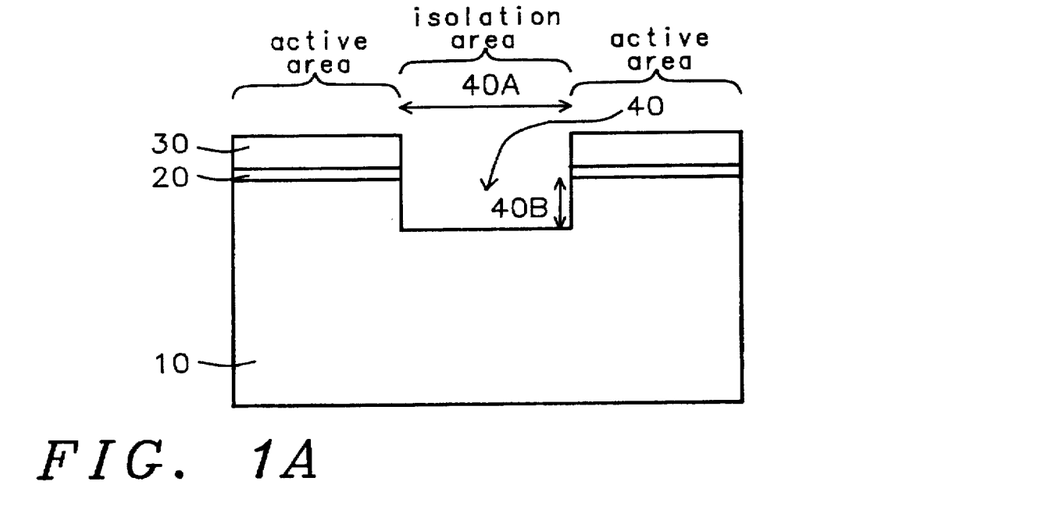
FIGS. 1A, 2A, 3A, 4A, 5A, and 6A are cross sectional views for illustrating a method for manufacturing forming a narrow trench isolation according to the present invention.
Figure 1B:
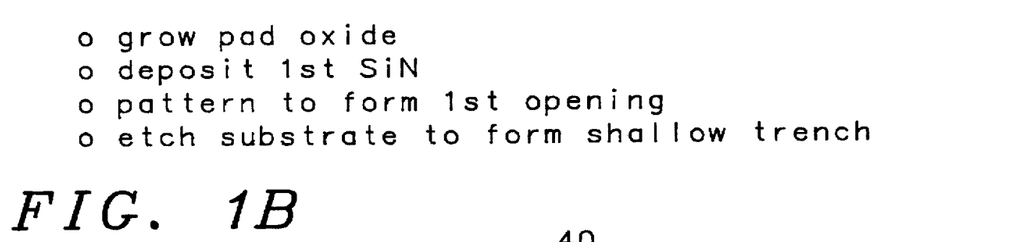
FIGS. 1B, 2B, 3B, 4B, and 6B explain the method for manufacturing forming a narrow trench isolation according to the present invention.

The method begins by forming a pad layer 20 over a semiconductor substrate 10 as shown in FIG. 1A. The pad layer 20 can comprise an oxide layer or a combination of polysilicon and oxide layers, such as a bottom oxide layer with an overlying polysilicon layer. Other combinations of pad layers are possible such as, ox - poly- ox., etc. Preferably the pad layer is composed of oxide ( e.g., pad oxide layer). The pad oxide layer 20 preferably is composed of silicon oxide having thickness in a range of between about 150 and 600 Å. The pad oxide layer is preferably formed using a thermal oxidation process.

Still referring to FIG. 1A, a first oxidation barrier layer (e.g., nitride layer ) layer 30 is formed over the pad oxide layer 20. The first oxidation barrier layer can be composed of any material or combination of materials that blocks oxygen diffusion, such as silicon nitride or oxynitride. The first barrier layer 30 preferably has a thickness in a range of between about 1000 and 2000 Å. The silicon nitride layer 30 can be formed by reacting silane and ammonia at atmospheric pressure at 700° to 900° C., or by reacting dichlorosilane and ammonia at reduced pressure at approximately 700° C. Also, silicon nitride can be formed by plasma enhance chemical vapor deposition by reacting silane with ammonia or nitrogen in a glow discharge between 200° and 350° C. The first nitride layer is preferably formed using a LPCVD process.

As shown in FIG. 1A, the first oxidation barrier (e.g., nitride) layer 30 and the pad layer 20 are patterned forming a first opening thereby exposing the substrate surface. The first opening defines the isolation area 14 where field oxide will be formed. The first opening preferably has a width 40A in a range of between about 0.25 and 0.5 µm.

FIG. 1A shows that substrate is then etched through the first opening forming a first trench 40 (shallow trench) in the substrate. The first trench has sidewalls and a bottom. The first trench preferably has a depth 40B from the substrate surface in a range of between about 0.15 and 0.3 µm.

Figure 2A:
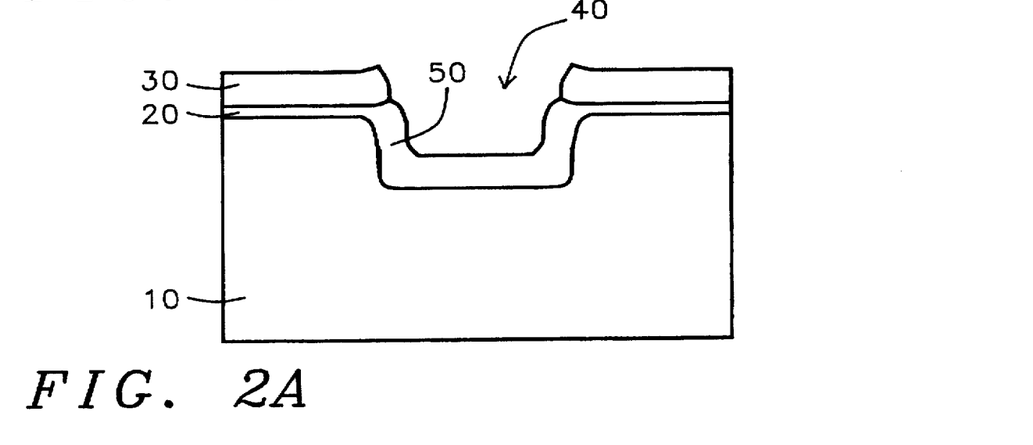
Figure 2B:
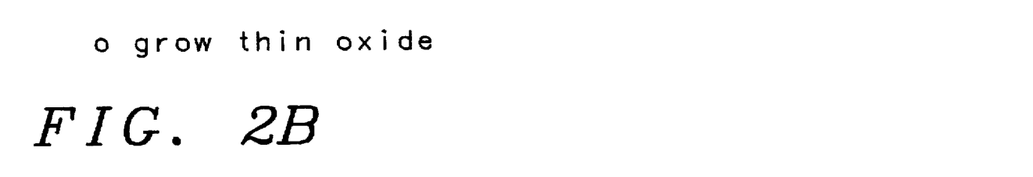

As shown in FIG. 2A, a thin oxide film 50 is grown over the substrate in the bottom and sidewalls of the first trench 40. The thin oxide film 50 preferably has a thickness in a range of between about 150 and 600 Å.

Figure 3A:
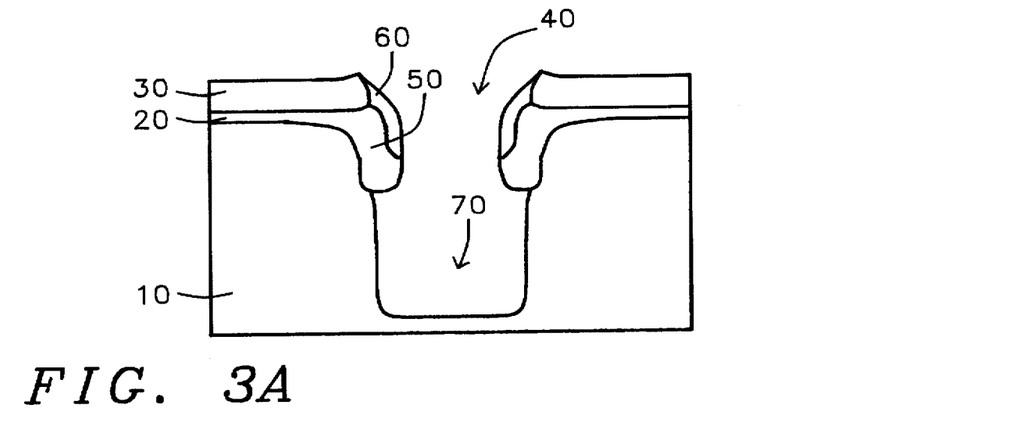
Figure 3B:
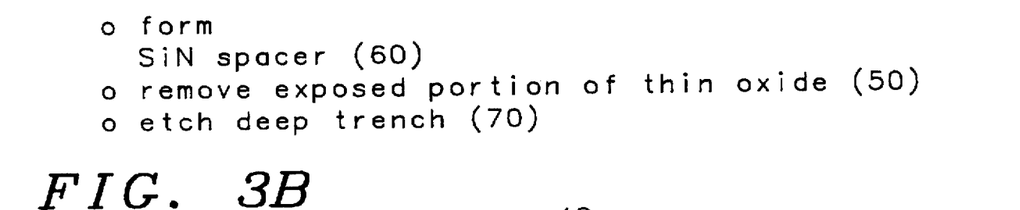

As shown in FIG. 3A, a spacer 60, preferably composed of silicon nitride or silicon oxynitride and more preferably composed of silicon nitride, is grown over the sidewalls of the first trench 40 and over the thin oxide layer 40 on the sidewalls of the trench. The silicon nitride spacer 60 preferably has a thickness in a range of between about 300 and 600 Å. The spacer 60 can be formed by depositing a silicon nitride layer over the substrate surface and anisotropically etching the silicon nitride layer back thereby forming the spacer 60.

The spacer 60 preferably has a length of about greater than or equal to 50% of the width the field oxide region and more preferably between about 50% and 55% of the width of the field oxide region. The spacer length is also about equal to the depth of the first trench is an more preferably between about 95% and 105% of the depth of the first trench.

Still referring to FIG. 3A, a portion of the thin oxide film 50 on the bottom of the trench is etched. The substrate in the bottom of the first trench is etched forming a deep second trench 70. The etch exposes portions of the substrate on the bottom of the second trench 70. The second trench 70 preferably has a depth from the surface of the substrate in a range of between about 1 and 6 µm.

The second trench is necessary to form a deep isolation (compared to a shallow isolation) which gives (1) better isolation, (2) isolates of deep electric elements (3) a narrower isolation can be used to increase the device density. We have found that etching a single deep trench, forming a spacer, and thermally oxidizing the single deep trench, results in a trench that is not filled. The spacer on the sidewall prevents the single deep trench from filling.

Subsequently, the exposed substrate surface in the second trench 70 is preferably wet shallow etched thereby removing any ion induced defects. The wet shallow etch preferably comprises a HF: $HNO_3$: $H_2O$ etch.

Figure 4A:
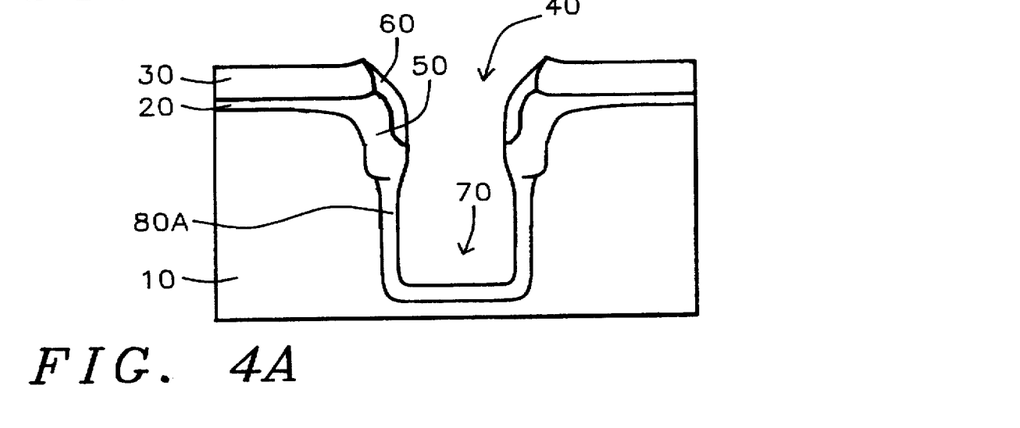
Figure 4B:
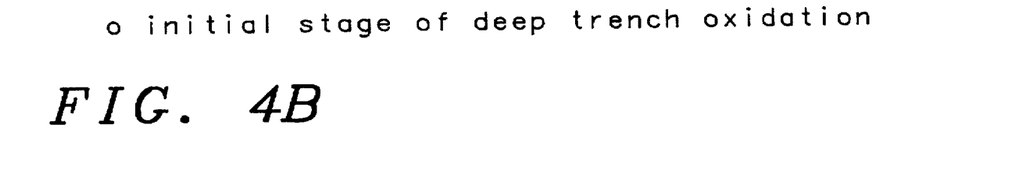

As shown in FIG. 4A, the bottom of the second (deep) trench 70 is oxidized forming a isolating oxide layer 80 thereby filling the second trench. The field oxide layer 80 preferably has a thickness of the depth of the second trench 70. The thermal oxidation process is preferably performed in a wet environment at a temperature in a range of between about 950° and 1100° C. and more preferably between about 1000° and 1100° C. It is critical that the temperature of the oxidation be above the temperature limits of $SiO_2$ viscous flow, ( e.g., above about 950° C).

Figure 5A:
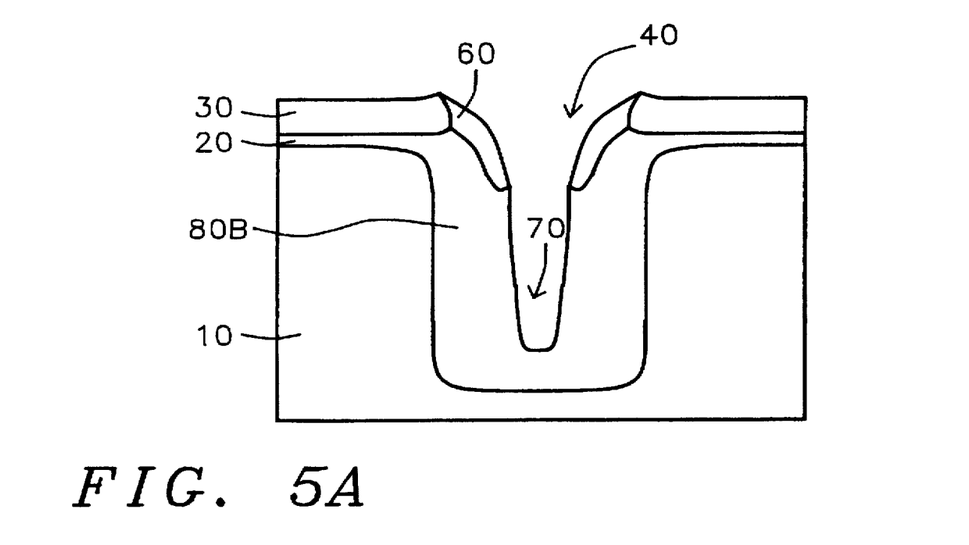
Figures 6A, 6B:
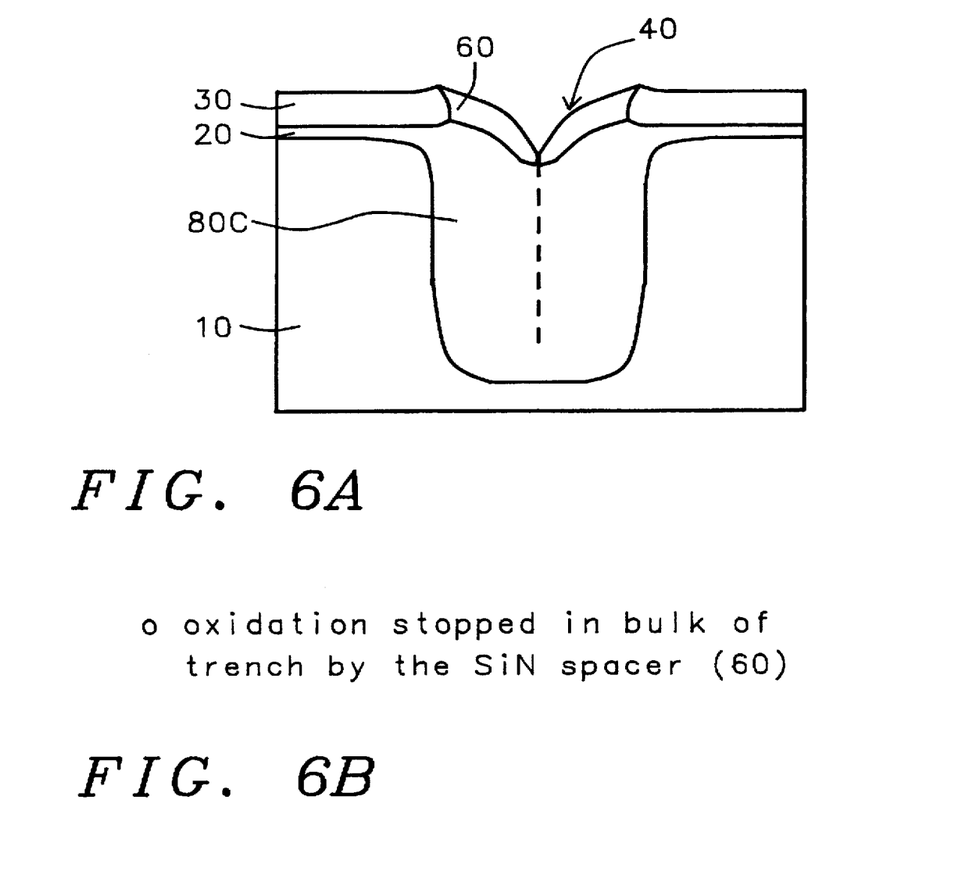

FIGS. 4A, 5A and 6A show the stages of the trench oxidation. FIG. 4A shows the initial oxidation growth. A thin oxide layer 80A is forming on the exposed portions of the trench wall and bottoms.

FIG. 5A shows the isolation oxide layer 80B thickening on the sidewalls and bottom of the trench. Oxygen is diffusing around the silicon nitride spacer 60 and the spacer 60 is being slowly lifted up. The spacer significantly retards the formation of the bird's beak under the first silicon nitride layer 50 around the edges of the field oxide layer 80.

FIG. 6A shows the field oxide layer 80C near a 3$^{rd}$ or final stage in the oxidation process. The field oxide 80E has stopped growing in the trench because the spacer 60 has lifted up thereby cutting off the diffusion of oxygen to the substrate in the trench 70. The spacer thereby its the oxide growth in the narrow trench.

Additional processes can be used to completely fill the entire trench 40 70. The bottom of the second trench 70 is filled by the oxidation process which may under some circumstance not fill the trench to the substrate surface. The trench can be completely filled with a layer with silicon, or a silicon oxide (e.g., TEOS). Planarization may be required for such a process.

FIGS. 7A to 7D show cross sectional drawings of a direct oxidation process. A direct oxidation isolation process of a narrow trench isolation in a silicon substrate comprises forming a deep trench in a silicon substrate and oxidizing the deep trench. The oxide grown in the trench is only controlled by the oxygen diffusion through the existing oxide layer 80. After the first stage of oxidation, the oxide layer thicknesses of the direct oxidation 100A (FIG. 7A) and the invention's 80A (FIG. 4A) are comparable.

Figure 7A:
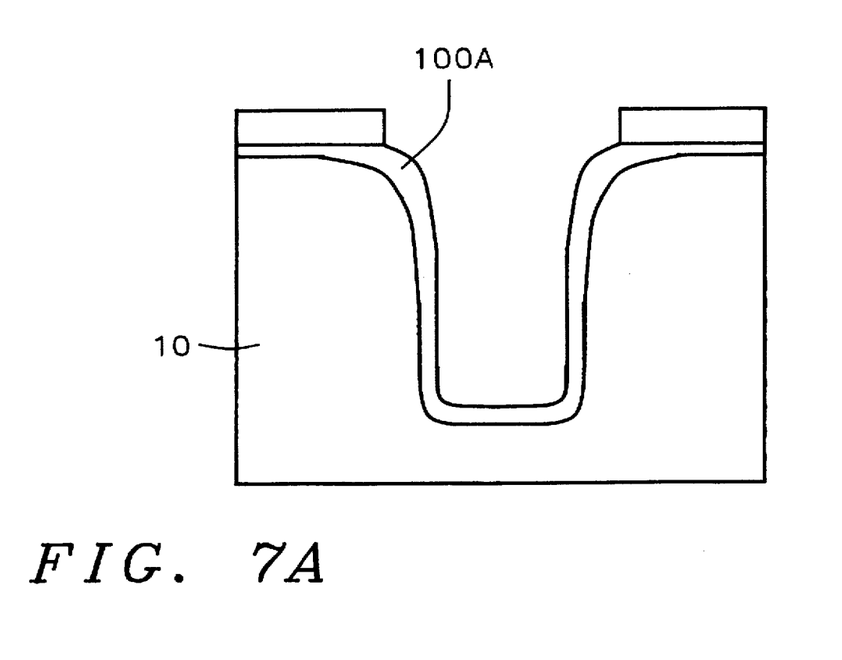
FIGS. 7A, 7B, 7C and 7D are cross sectional profiles for a trench isolation regions formed using a process of direct oxidation.
Figure 7B:
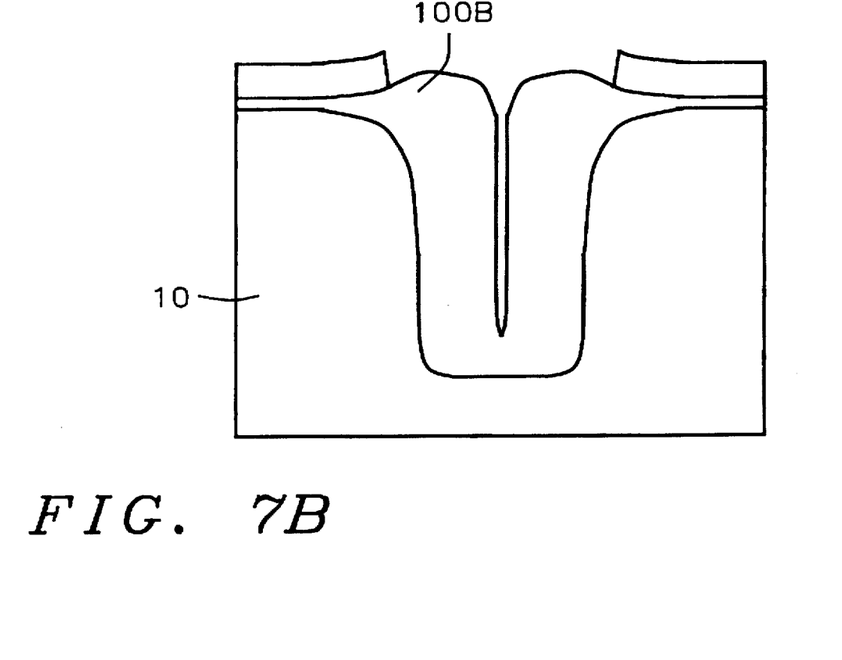
Figure 7C:
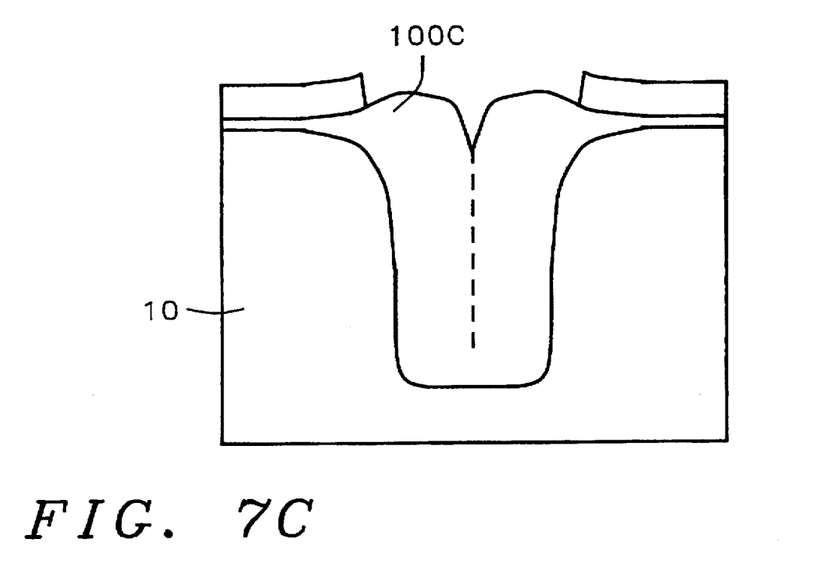
Figure 7D:
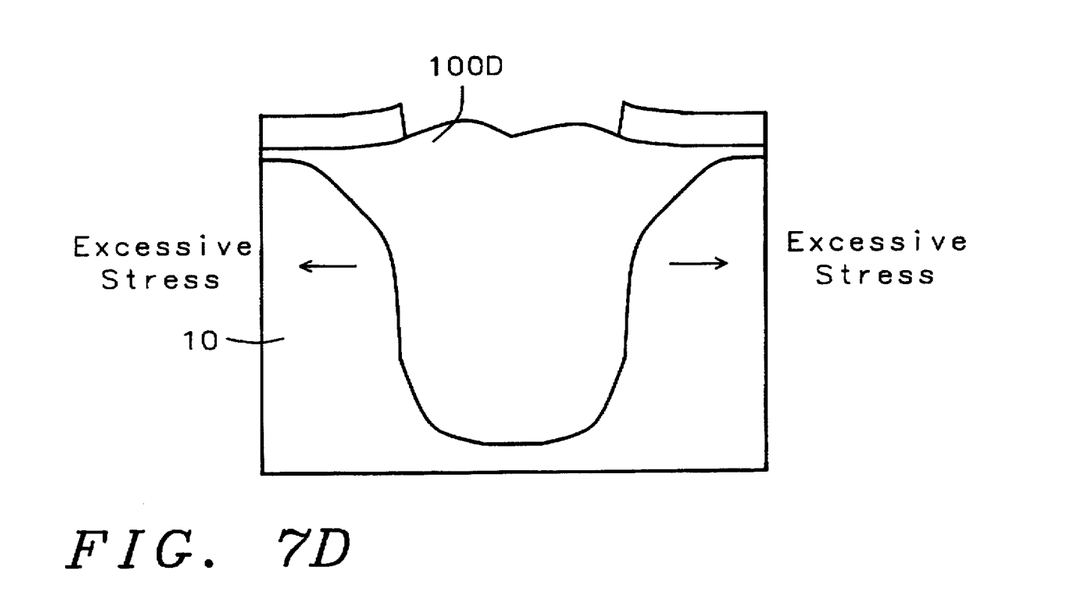

After a second oxide growth stage, (See FIG. 7B—direct oxidation and FIG. 5A—invention) the oxide in the invention's process 80B is thinner than in the direct oxidation process 100B (without the spacer and second trench). Finally, at the last stages of oxidation of the invention, shown in FIG. 6A, the nitride spacer 60 has stopped the diffusion of oxygen to the substrate and therefore stopped the oxidation process. In contrast, as shown in FIGS. 7C and 7D for the direct oxidation process, the oxidation continues. In the direct oxidation process, the volume expansion from the continued oxidation 100D creates extremely high stress on the trench sidewalls. This creates defects in the substrate that affect device yields. In contrast, the invention's slowed oxidation rate gives the viscous oxide more time to flow to relieve stress (the oxide flow rate is higher than the oxidation rate).

Figure 8A:
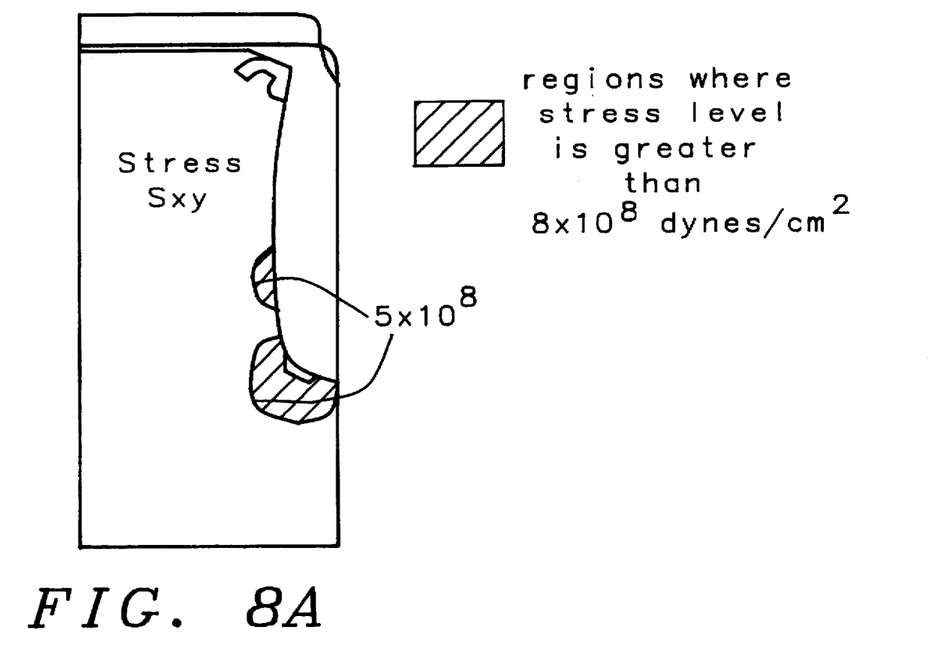
FIGS. 8A, 8C, and 8E show cross sectional diagrams of the Stress components for a deep trench isolation oxide formed using the process of the present invention.
Figure 8B:
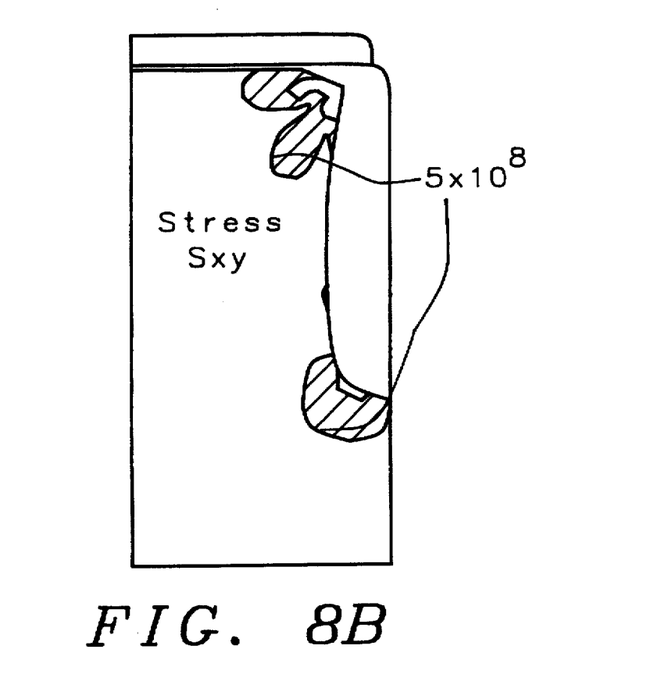
FIGS. 8B, 8D and 8F show cross sectional diagrams of the Stress components for a trench isolation oxide formed using a direct oxidation process.
Figure 8C:
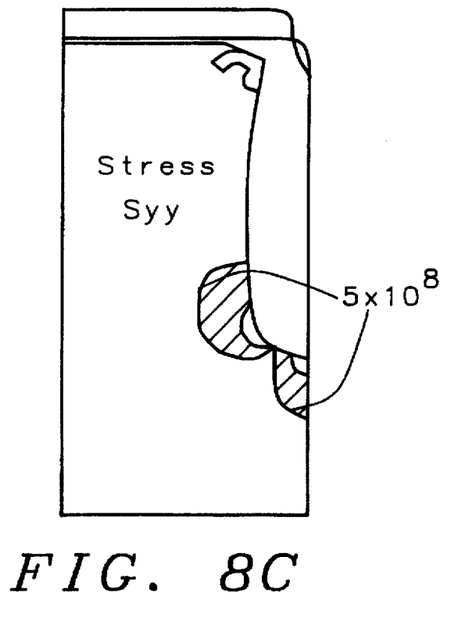
Figure 8D:
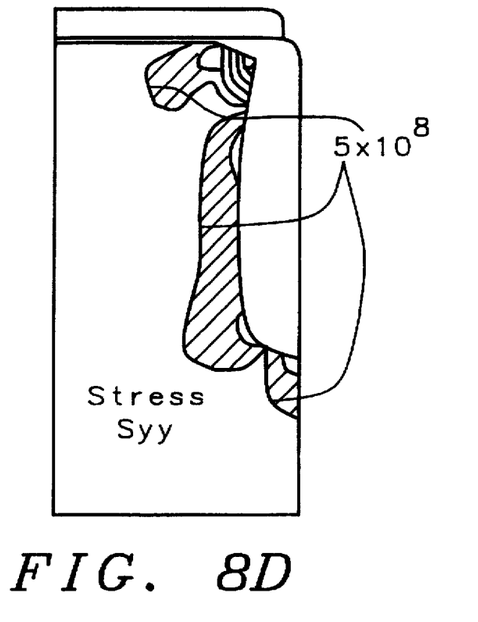
Figure 8E:
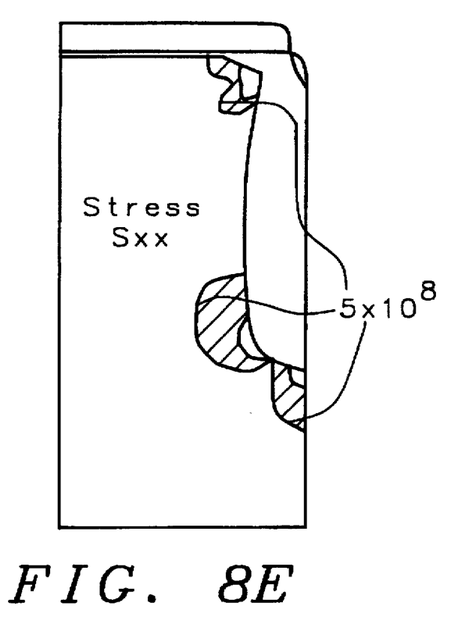
Figure 8F:
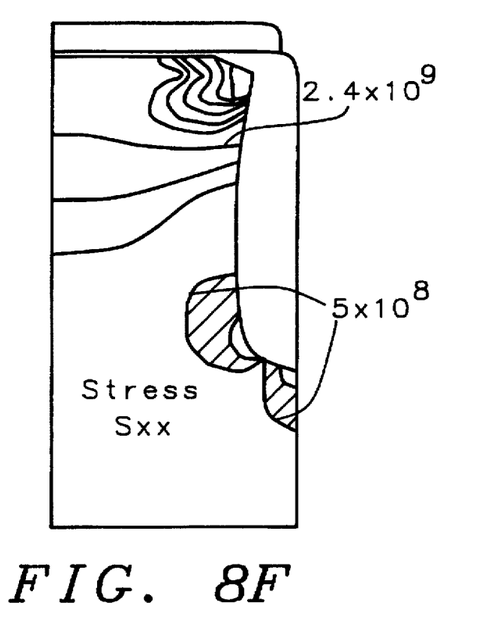

FIGS. 8A through 8F illustrate stress analysis of the (3) components of stress fields in the whole isolation structure. These figures show the distribution of the absolute values of Sxx, Syy, and Sxy components of stress tensor in the active isolated regions. Calculations Were done by TSUPREEM 4 simulation tools and correspond to the state of oxidation for the invention as shown in FIG. 6A (for FIGS. 8A (Stress Sxy), 8C (stress Syy), 8E (stress Sxx) and for the method of direct oxidation as shown in FIG. 7C for (FIGS. 8B (Sxy), 8D (Syy), and 8F (Sxx)). FIG. 8A contains a legend applicable to FIGS. 8A–8F.

A stress level of about 5E8 dyne/cm$^2$ can be considered as potentially critical for dislocation generation in silicon. The trench of the invention creates less stress than direct oxidation processes. Comparison of the stress in the invention's isolation (FIGS. 8A, 8C, 8E) and the direct oxidation isolation (FIGS. 8B, 8D and 8F) show that the volume of isolated silicon regions with stress greater than 5E8 dynes/cm$^2$ is considerably larger for the direct oxidation of trench, especially for Sxx component. Therefore, the method of the invention produces deep trench isolation with less stress.

The invention provides a process for forming a narrow deep trench isolation regions using a thermal oxidation. The spacers of the invention stop the oxidation of the substrate in the trench by blocking off the oxygen diffusion path. The unique deep second trench 70 of the invention allows the trench to be made deeper and allows the spacer to function to a self regulate the oxidation rate. The spacer's suppression of the trench oxidation reduces stress on the trench sidewall. The slowed oxidation rate allows the viscous oxide to flow thereby reducing stress. This reduced stress reduces silicon defects which increases yields. The invention has the combination of the (1) nitride spacers 60 and (2) second trench etch, that make it possible to form deep and narrow isolation with dense filling of deep trench isolation using a thermal oxide and prevent the stress defects.

While the invention has been particularly shown and described with reference to the preferred embodiments thereof, it will be understood by those skilled in the art that various changes in form and details may be made without departing from the spirit and scope of the invention.

What is claimed is:

1. A method of fabrication of a narrow deep trench isolation on a semiconductor substrate, comprising the steps of:
    a) forming a pad layer over a semiconductor substrate;
    b) forming a first barrier layer over said pad layer;
    c) patterning said first barrier layer and said pad layer forming a first opening;
    d) etching said substrate through said first opening forming a first trench in said substrate; said first trench having sidewalls and a bottom;
    e) growing a thin oxide film over said substrate in said bottom and sidewalls of said first trench;
    f) forming nitride spacers over said sidewalls of said first trench and over said thin oxide layer on said sidewalls of said first trench; said nitride spacers having ends;
    g) etching a portion of said thin oxide film on said bottom of said trench and etching said substrate in said bottom of said first trench forming a second trench, the etch exposing portions of said substrate on the bottom of said second trench; and
    h) oxidizing said bottom of said second trench forming a field oxide layer thereby at least partially filling said second trench, and said field oxide layer pushing up said ends of said nitride spacers reducing a rate of oxidation of said substrate at said bottom of said second trench; said spacers having a length greater than 50% of the width of said field oxide region.

2. The method of claim 1 which further includes filling said second trench with a planarizing layer to at least the level of the substrate surface and planarizing said planarizing layer.

3. The method of claim 1 wherein said first opening having width in a range of between about 0.25 and 0.5 µm.

4. The method of claim 1 wherein said first trench has a depth from the substrate surface in a range of between about 0.15 and 0.3 µm.

5. The method of claim 1 wherein said nitride spacers have a width in a range of between about 300 and 600 Å.

6. The method of claim 1 wherein said second trench has a depth from the surface of said substrate in a range of between about 1.0 and 6.0 µm.

7. The method of claim 1 which further includes after step (g), liquid shallow etching the exposed substrate surface in said second trench thereby removing any ion induced defects.

8. A method of fabrication of a narrow deep trench isolation on a semiconductor substrate, comprising the steps of:
    a) forming a pad oxide layer over a semiconductor substrate;
    b) forming a first barrier nitride layer over said pad oxide layer;
    c) patterning said first barrier nitride layer and said pad oxide layer forming a first opening;
    d) etching said substrate through said first opening forming a first trench in said substrate; said first trench having sidewalls and a bottom;

e) growing a thin oxide film over said substrate in said bottom and sidewalls of said first trench;

f) forming nitride spacers over said sidewalls of said first trench and over said thin oxide layer on said sidewalls of said first trench; said nitride spacers having ends;

g) etching a portion of said thin oxide film on said bottom of said first trench and etching said substrate in said bottom of said first trench forming a second trench, the etch exposing portions of said substrate on the bottom of said second trench; and h) oxidizing the bottom of said second trench forming an isolation oxide layer thereby at least partially filling said second trench; and said field oxide layer pushing up said ends of said nitride spacers from said sidewalls so that said nitride spacers meet thereby reducing a rate of oxidation of said substrate; and said nitride spacers have a length of about greater than or equal to 50% of a width said field oxide region.

9. The method of claim 8 which further includes filling said second trench with an planarizing layer to at least the level of the substrate surface and planarizing said planarizing layer.

10. The method of claim 8 wherein said first opening has width in a range of between about 0.25 and 0.5 μm.

11. The method of claim 8 wherein said first trench has a depth from the substrate surface in a range of between about 0.15 and 0.3 μm.

12. The method of claim 8 wherein said nitride spacer has a width in a range of between about 300 and 600 Å.

13. The method of claim 8 which further includes after step (g), liquid shallow etching the exposed substrate surface in said second trench thereby removing any ion induced defects.

14. The method of claim 1 wherein said nitride spacers have a length of about greater than or equal to 50% of the width said field oxide region.

15. The method of claim 1 wherein step (h) further includes: said field oxide layer pushing up said ends of said silicon nitride spacers away from said sidewalls so that said ends meet thereby stopping the oxidation of said substrate on said bottom of said second trench.

16. The method of claim 1 wherein step (h) further includes the oxidation of said bottom of said second trench performed using a thermal oxidation process in a wet environment at a temperature in a range of between about 950° and 1100° C.

17. The method of claim 8 wherein step (h) further includes: said field oxide layer pushing up said ends of said silicon nitride spacers away from said sidewalls so that said ends meet thereby stopping the oxidation of said substrate on said bottom of said second trench.

18. The method of claim 8 wherein step (h) further includes the oxidation of said bottom of said second trench performed using a thermal oxidation process in a wet environment at a temperature in a range of between about 950° and 1100° C.

19. A method of fabrication of a narrow deep trench isolation on a semiconductor substrate, comprising the steps of:

a) forming a pad oxide layer over a semiconductor substrate;

b) forming a first barrier nitride layer over said pad oxide layer;

c) patterning said first barrier nitride layer and said pad oxide layer forming a first opening;

d) etching said substrate through said first opening forming a first trench in said substrate; said first trench having sidewalls and a bottom;

e) growing a thin oxide film over said substrate in said bottom and sidewalls of said first trench;

f) forming a nitride spacers over said sidewalls of said first trench and over said thin oxide layer on said sidewalls of said first trench; said nitride spacers have a length between about 95% and 105% of the depth of said first trench; said nitride spacers having an end;

g) etching a portion of said thin oxide film on said bottom of said first trench and etching said substrate in said bottom of said first trench forming a second trench, the etch exposing portions of said substrate on the bottom of said second trench; and h) oxidizing the bottom of said second trench forming an isolation oxide layer thereby at least partially filling said second trench; and said field oxide layer pushing up said ends of said silicon nitride spacers so that said ends met thereby stopping the oxidation of said substrate; and said nitride spacers have a length of about greater than or equal to 50% of a width said field oxide region; and the oxidation of said bottom of said second trench performed using a thermal oxidation process in a wet environment at a temperature in a range of between about 950°and 1100° C.

* * * * *